(12) United States Patent
Warnock

(10) Patent No.: US 9,891,276 B2
(45) Date of Patent: Feb. 13, 2018

(54) PERFORMANCE-SCREEN RING OSCILLATOR (PSRO) USING AN INTEGRATED CIRCUIT TEST SIGNAL DISTRIBUTION NETWORK

(71) Applicant: International Business Machines Corporation, Armonk, NY (US)

(72) Inventor: James D. Warnock, Somers, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/811,183

(22) Filed: Jul. 28, 2015

(65) Prior Publication Data

US 2017/0030967 A1 Feb. 2, 2017

(51) Int. Cl.
*G01R 31/3187* (2006.01)
*G01R 31/28* (2006.01)
*H03K 3/03* (2006.01)

(52) U.S. Cl.
CPC ..... *G01R 31/2896* (2013.01); *G01R 31/2884* (2013.01); *H03K 3/0315* (2013.01)

(58) Field of Classification Search
CPC .............. G01R 19/257; G01R 31/2884; G01R 31/3004; G01R 31/3181; G01R 31/31813
See application file for complete search history.

(56) References Cited

U.S. PATENT DOCUMENTS

| | | | |
|---|---|---|---|
| 5,126,691 A * | 6/1992 | Mijuskovic | G06F 1/025 331/1 A |
| 5,796,751 A | 8/1998 | Kundu | |
| 5,818,250 A | 10/1998 | Yeung et al. | |
| 6,515,549 B2 | 2/2003 | Nakano | |
| 6,944,810 B2 | 9/2005 | Oberle et al. | |
| 7,423,288 B2 | 9/2008 | Aghababazadeh et al. | |
| 7,482,886 B1 * | 1/2009 | Kingsley | G01R 31/31726 327/263 |
| 7,532,078 B2 | 5/2009 | Agarwal et al. | |
| 7,765,445 B2 | 7/2010 | Eckelman et al. | |
| 7,805,693 B2 | 9/2010 | Chadwick et al. | |
| 8,214,699 B2 | 7/2012 | Arsovski et al. | |
| 8,841,974 B2 | 9/2014 | Sul et al. | |
| 9,557,378 B2 | 1/2017 | Bickford et al. | |

(Continued)

OTHER PUBLICATIONS

List of IBM Patents or Patent Applications Treated As Related—Date Filed: Mar. 13, 2017; 2 pages.

*Primary Examiner* — Tung X Nguyen
(74) *Attorney, Agent, or Firm* — Cantor Colburn LLP; William A. Kinnaman, Jr.

(57) ABSTRACT

Embodiments relate to an integrated circuit comprising a performance-screen ring oscillator (PSRO). An aspect includes a test signal distribution network, the test signal distribution network including a plurality of flushable pipeline latches, the test signal distribution network configured to deliver a test signal simultaneously, via the plurality of flushable pipeline latches, to each of a plurality of local clock buffers associated with components of the integrated circuit at a plurality of signal outputs. Another aspect includes a PSRO including an input multiplexer that outputs an oscillator signal to an input of a branch of the test signal distribution network; and a return path from a signal output of the branch of the test signal distribution network to the input multiplexer.

11 Claims, 6 Drawing Sheets

(56) References Cited

U.S. PATENT DOCUMENTS

| | | |
|---|---|---|
| 2002/0129293 A1 | 9/2002 | Hutton et al. |
| 2014/0132290 A1 | 5/2014 | Charlebois et al. |
| 2014/0237310 A1 | 8/2014 | Cheng et al. |
| 2017/0030968 A1 | 2/2017 | Warnock |

* cited by examiner

PERFORMANCE-SCREEN RING OSCILLATOR (PSRO) USING AN INTEGRATED CIRCUIT TEST SIGNAL DISTRIBUTION NETWORK

BACKGROUND

The present invention relates generally to integrated circuit testing, and more specifically, to a performance-screen ring oscillator (PSRO) using an integrated circuit test signal distribution network.

High-speed testing may be used to screen integrated circuits for basic device speed and health-of-technology metrics. For a microprocessor integrated circuit design, it is possible to carry out high-speed testing of the die on-wafer to get an idea of how fast the processor can run before investing the resources to package the design. Further high-speed testing may also be performed after the design is packaged. High-speed testing may require relatively complex, expensive equipment, and it may be difficult to pinpoint the root cause of any issued detected by such testing.

High-speed testing may be performed by placing performance-screen ring Oscillators (PSROs) at various points on the integrated circuit, for example, in a kerf region. The oscillation frequency can be read out from the PSROs on the integrated circuit, giving a direct measurement of the device performance at different points on the integrated circuit. However, PSRO structures may require a relatively large amount of space on the integrated circuit, and, depending on placement, may not give accurate data as to the performance of the integrated circuit.

SUMMARY

Embodiments relate to an integrated circuit comprising PSRO. An aspect includes a test signal distribution network, the test signal distribution network comprising a plurality of flushable pipeline latches, the test signal distribution network configured to deliver a test signal simultaneously, via the plurality of flushable pipeline latches, to each of a plurality of local clock buffers associated with components of the integrated circuit at a plurality of signal outputs. Another aspect includes a PSRO comprising an input multiplexer that outputs an oscillator signal to an input of a branch of the test signal distribution network; and a return path from a signal output of the branch of the test signal distribution network to the input multiplexer.

Further embodiments relate to a method of testing an integrated circuit. An aspect includes forming a PSRO on the integrated circuit. Another aspect includes a branch of a test signal distribution network, the test signal distribution network comprising a plurality of flushable pipeline latches, the test signal distribution network configured to deliver a test signal simultaneously, via the plurality of flushable pipeline latches, to each of a plurality of local clock buffers associated with components of the integrated circuit at a plurality of signal outputs. Another aspect includes an input multiplexer that outputs an oscillator signal to an input of a branch of the test signal distribution network. Another aspect includes a return path from a signal output of the branch of the test signal distribution network to the input multiplexer. Yet another aspect includes testing the integrated circuit by determining an oscillation frequency of the PSRO.

Further embodiments relate to a performance-screen ring oscillator (PSRO) for an integrated circuit. An aspect includes a branch of a test signal distribution network, the test signal distribution network comprising a plurality of flushable pipeline latches, the test signal distribution network configured to deliver a test signal simultaneously, via the plurality of flushable pipeline latches, to each of a plurality of local clock buffers associated with integrated circuit components of the integrated circuit at a plurality of signal outputs. Another aspect includes an input multiplexer that outputs an oscillator signal to an input of a branch of the test signal distribution network. Yet another aspect includes a return path from a signal output of the branch of the test signal distribution network to the input multiplexer.

BRIEF DESCRIPTION OF THE DRAWINGS

The subject matter which is regarded as embodiments is particularly pointed out and distinctly claimed in the claims at the conclusion of the specification. The forgoing and other features, and advantages of the embodiments are apparent from the following detailed description taken in conjunction with the accompanying drawings in which:

DETAILED DESCRIPTION

Embodiments of a PSRO using a test signal distribution network of an integrated circuit are provided, with exemplary embodiments being discussed below in detail. Embodiments of a PSRO are formed on an integrated circuit using a test signal distribution network of the integrated circuit, thereby allowing elements that are used within the integrated circuit for another purpose to also be used in the PSRO. Such a PSRO utilizes elements that are mixed in with other integrated circuit components, so that the output of the PSRO may give a good indication of the actual integrated circuit performance. In some embodiments, the PSRO links the test signal distribution network with a scan return path of the integrated circuit to form the oscillator loop.

The test signal distribution network is made up of a plurality of flushable pipeline latches that synchronously send test control signals from a central location (i.e., a built-in self test module, or BIST module) to all circuitry on the processor integrated circuit. The pipeline latches of the test signal distribution network are arranged to ensure that test control signals arrive synchronously at all of the local clock buffer (LCB) controls of the various integrated circuit components. Therefore, a relatively large number of pipeline latches may be spread across the integrated circuit. For low-frequency testing, the pipeline latches also have a flush path which allows low-speed data to reach LCB controls with no intervening global clock cycles. Test data is flushed from the BIST module through the pipeline latches to all the LCBs for low-frequency testing. The scan data for testing is broken into many strings (for example, 1000 latch bits per string). Output from each integrated circuit component corresponding to each scan string is then sent back to the BIST module via the scan return path. While pipeline latches may be present in the scan return path, the scan return path is generally run at a lower frequency than the full functional frequency of the integrated circuit, such that relatively few pipeline latches may be required in the scan return path.

Embodiments of a PSRO are made by adding circuitry to the integrated circuit to link a flush path of the flushable pipeline latches of the signal distribution network to the scan return path. In the inbound segment comprising the scan return path, which leads back to the BIST control, circuitry is also added to bypass any pipeline latches in the scan return path. Multiple PSROs may be formed in a single integrated circuit using different flush paths and scan return paths on the integrated circuit; therefore, relatively little additional hardware is required to form multiple PSROs for integrated circuit testing, providing the ability to characterize process speed for circuits spanning a wide variety of physically different paths on the integrated circuit.

Figure 1:
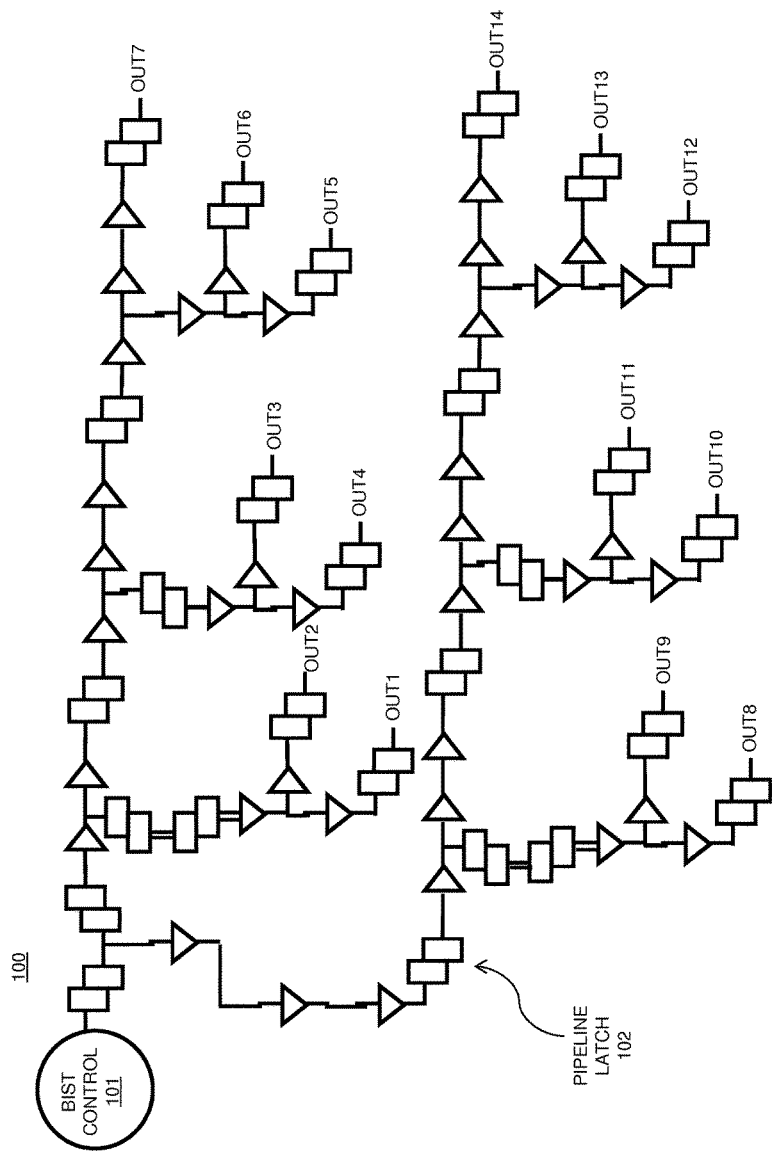
FIG. 1 depicts a test signal distribution network comprising flushable pipeline latches on an integrated circuit in accordance with an embodiment.

FIG. 1 illustrates an embodiment of a test signal distribution network 100 for use on an integrated circuit. The test signal distribution network 100 includes a plurality of flushable pipeline latches, such as pipeline latch 102, located between a built-in self test (BIST) control 101 and a plurality of signal outputs OUT1 to OUT14. Each of signal outputs OUT1 to OUT14 is connected to a respective LCB, or multiple LCBs, of an integrated circuit component. The number of pipeline latches located between BIST control 102 and each of signal outputs OUT1 to OUT14 is the same, e.g., five, as shown in FIG. 1. When the pipeline latches are being clocked from the global clock, any signal launched from the BIST control 102 will arrive after 5 cycles at each of the outputs OUT1 to OUT 14, regardless of the physical distance between each output and the BIST control 102. FIG. 1 is shown for illustrative purposes only; a test signal distribution network may have any appropriate number of pipeline latches between the BIST control and each of the signal outputs. As discussed below, in various embodiments, a PSRO may be constructed using any one of the outputs of the test signal distribution network, or a plurality of PSROs may be constructed on the integrated circuit, each using a different signal output of the test signal distribution network. In such embodiments, each of the different PSROs which will be sensitive to silicon process speed on different parts of the integrated circuit.

Figure 2A:
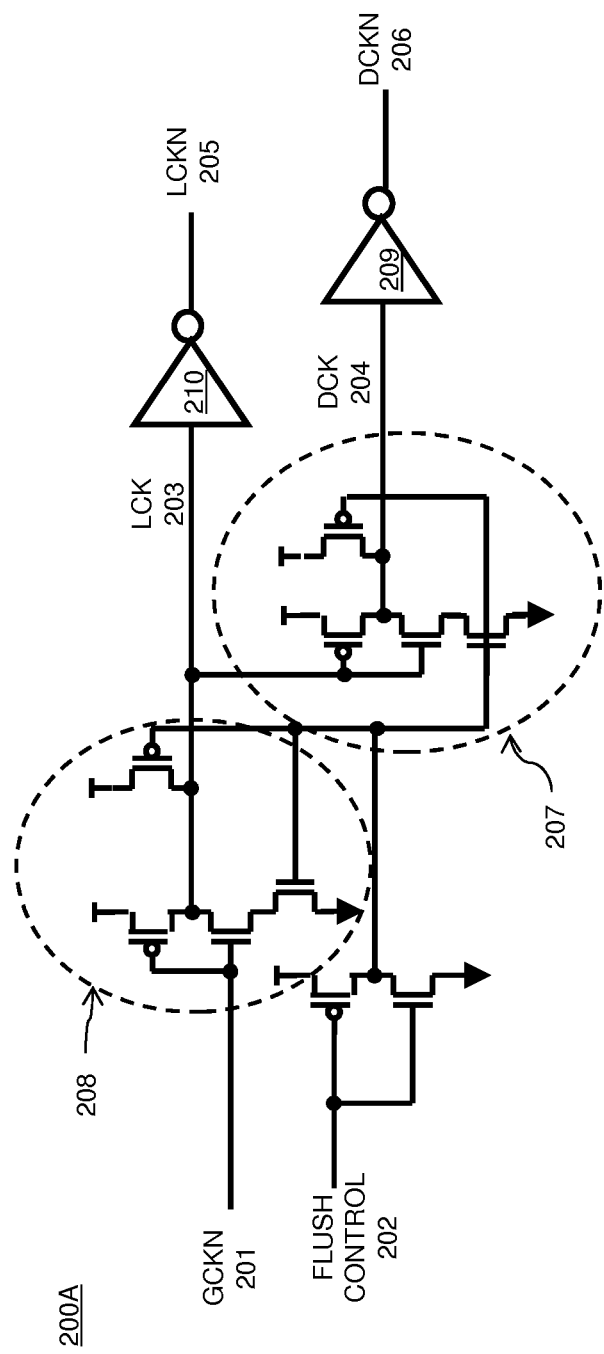
FIGS. 2A and 2B depict a flushable pipeline latch in accordance with an embodiment.
Figure 2B:
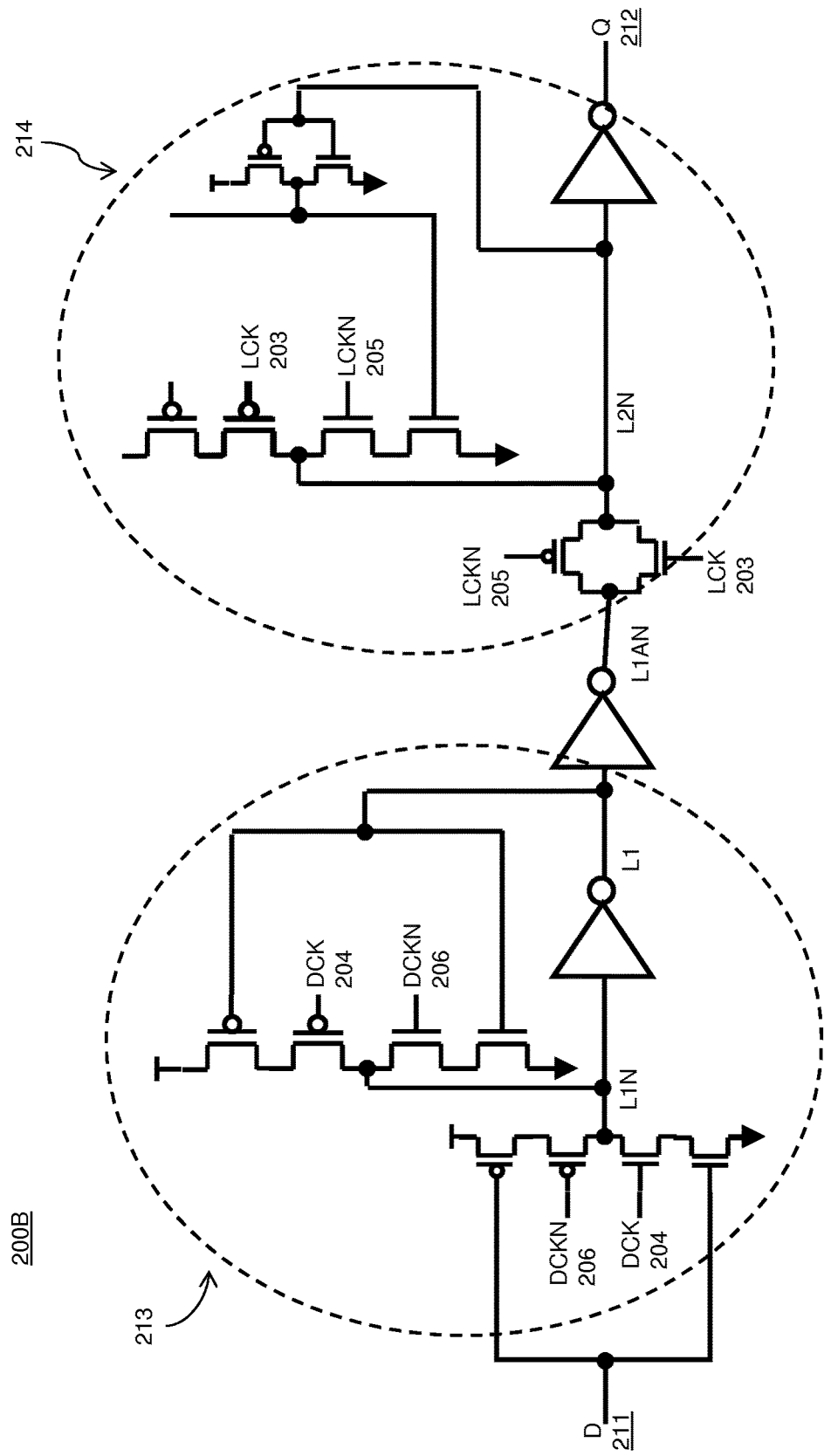

FIGS. 2A-B illustrate an example of a flushable pipeline latch comprising pipeline latch portions 200A-B, which may comprise each of the flushable pipeline latches such as pipeline latch 102 that are shown in FIG. 1 in some embodiments. As shown in FIG. 2A, first portion 200A of the pipeline latch of FIGS. 2A-B includes a global clock input (GCKN) 201, and a flush control input 202. The GCKN 201 and flush control input 202 are provided to NAND gates 207 and 208, which provide the ability to force both clocks LCKN 203 and DCKN 204 to a low state via respective inverters 210 and 209. First stage 200A provides four signals to the second portion 200B: LCK 203, DCK 204, LCKN 205 and DCKN 206. Second portion 200B of FIG. 2B includes a first latch 213 and a second latch 214. The two latches 213 and 214 comprise a master-slave latch pair. The latches 213 and 214 receive the LCK 203, DCK 204, LCKN 205 and DCKN 206 signals provided by the first portion 200A of FIG. 2A as shown in FIG. 2B. A high input on flush control 202 of FIG. 2A forces both of LCKN 203 and DCKN 204 low, in which case any data signal arriving at the data input D 211 of the latch pair 213/214 in FIG. 2B will flush directly through to the output Q 212 regardless of the state of the global clock (GCKN 201). In PSRO mode, which is discussed below, the input on the flush control 202 is high. FIGS. 2A-B are shown for illustrative purposes only; a flushable pipeline latch that may be used in conjunction with a PSRO may have any appropriate configuration.

Figure 3:
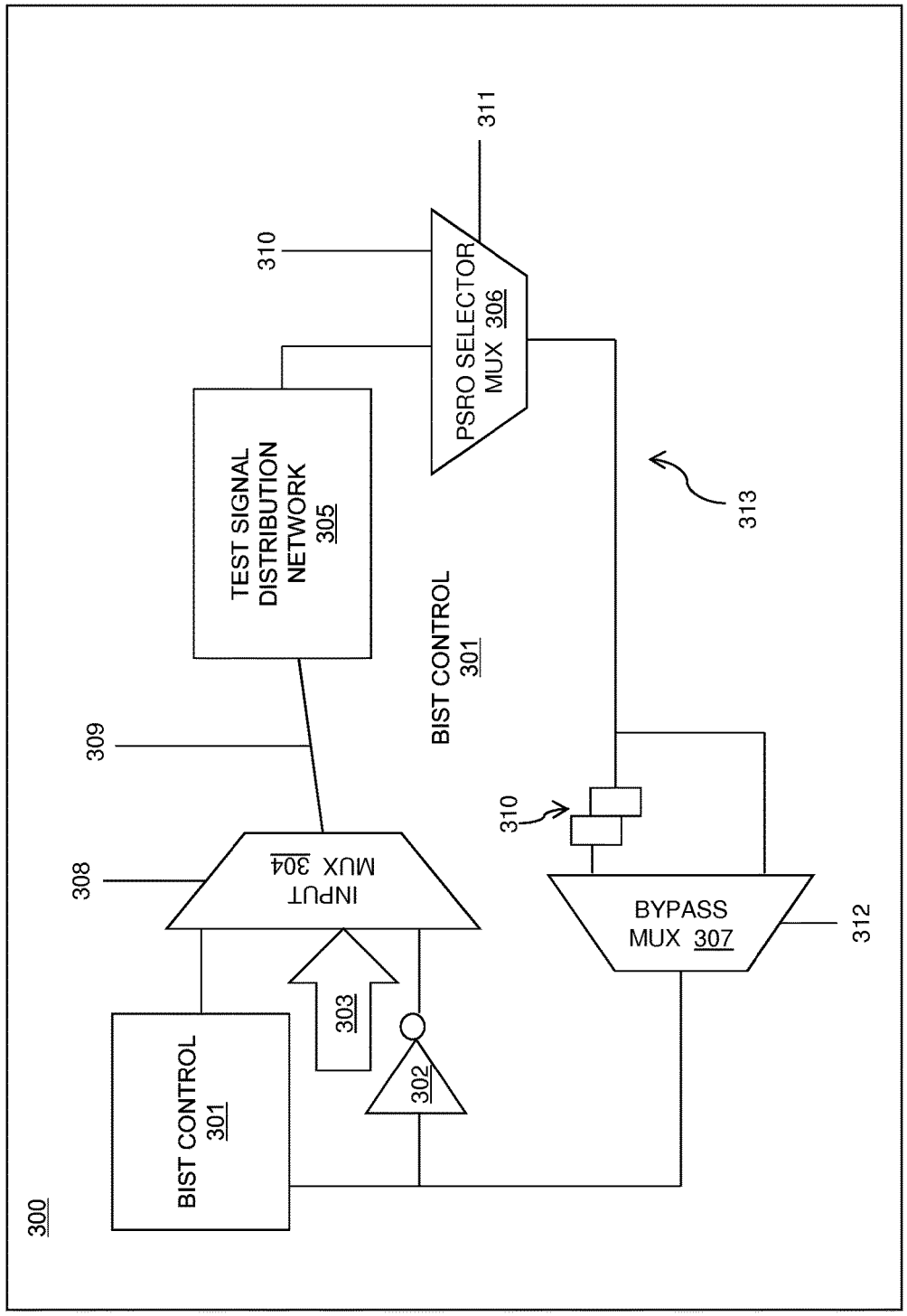
FIG. 3 depicts a PSRO using a test signal distribution network of an integrated circuit in accordance with an embodiment.

FIG. 3 illustrates an embodiment of an integrated circuit 300 including a PSRO using a test signal distribution network. Integrated circuit 300 may, in various embodiments, include any other appropriate integrated circuit elements, having any appropriate layout, that may be tested using the PSRO that is shown in FIG. 3. The PSRO is made up of BIST control 301, which may correspond to BIST control 101 of FIG. 1, and is connected to test signal distribution network 305, which may correspond to test signal distribution network 100 of FIG. 1, via input multiplexer (MUX) 304. Input MUX 304 is controlled by PSRO enable input 308, which selects a particular PSRO for testing of the integrated circuit 300. An output of test signal distribution network 305, which may be any of outputs OUT1 to OUT 14 as shown in FIG. 1, is taken as an input by PSRO selector MUX 306. Selector MUX 306 also receives a scan output as an input 310, and is controlled by scan disable input 311, which selects between scan mode (i.e., input 310) and PSRO mode (i.e., the output from test signal distribution network 305). The scan mode input 310 is used for low frequency testing of the integrated circuit component connected to the LCB corresponding to to the test signal distribution output that is connected to PSRO selector MUX 306. The output of the PSRO selector MUX 306 is provided to the return path 313. As shown in FIG. 3, the output of PSRO selector MUX 306 is input to bypass MUX 307, which bypasses pipeline latch 310 in the return path 313 based on input from bypass enable input 312, which enables bypass of the pipeline latch 310 when the PSRO is enabled. In embodiments in which pipeline latch 310 is flushable, the bypass MUX 307 may be omitted in the PSRO. The output of bypass MUX 307 is received by PSRO inverter 302, which outputs the PSRO oscillation signal to the input MUX 304, completing the PSRO ring. Input MUX 304 may also receive a plurality of other PSRO inputs 303 from other PSROs on the integrated circuit 300. Each of these PSRO inputs 303 may correspond to a different signal output (for example, any of outputs OUT1 to OUT 14 of FIG. 1) of test signal distribution network 305, and may, in some embodiments, include a respective PSRO inverter. The oscillation frequency of the PSRO is read out at output 309, allowing the device speed of the integrated circuit 300 to be characterized. In order to enable the PSRO, the PSRO enable input 308 selects a particular PSRO of PSRO inputs 303 at Input MUX 304; the scan disable input 311 is set to enable PSRO mode, such that the output from the test signal distribution network 305 is output to the return path 313, and the bypass enable input 312 is enabled to as to bypass pipeline latch 310 via bypass MUX 307 in the return path 313.

In some embodiments, the return path 313 may comprise a scan return path of the integrated circuit 300; in other embodiments, a separate return path is provided. For scan testing of the latches on the integrated circuit 300, a scan chain is broken up into many short scan strings to allow for parallel scanning of the integrated circuit design, rather than having one relatively long serial chain of millions of latches. Each of these short segments requires a path back to the BIST 301. In general, many such paths may be multiplexed together on the way back to the BIST 301; there is path back to the BIST for each scan chain on the integrated circuit.

This scan return path may therefore be used to complete the ring for the PSRO as shown in FIG. 3.

The additional circuitry required for the PSRO includes the input MUX 304, the PSRO selector MUX 306, PSRO inverter 302, and, for any non-flushable pipeline latches in the return path 313, such as pipeline latch 310, a bypass MUX 307. Multiple PSROs may be formed on a single integrated circuit 300 in some embodiments using relatively little additional hardware, using various branches of the test control signal distribution network (e.g., signal outputs OUT1-OUT14 shown in FIG. 1), and corresponding scan return paths. Input MUX 304 may be part of each of the plurality of PSROs in such embodiments, while each PSRO may require a respective PSRO inverter 302, PSRO selector MUX 306, and one or more bypass MUXes 307. The signal output 309 may be used to observe any of the PSROs, as determined by the PSRO enable input 308 of the input MUX 304. The PSROs will contain delay components from pipeline latches (in flush mode), loaded buffers, and wire resistance/capacitance, similar to the actual digital logic paths of the integrated circuit 300, allowing relatively good tracking with the maximum frequency of the integrated circuit. In some embodiments, a plurality of PSROs may be formed on the integrated circuit using the various outputs of the test signal distribution network, and the PSRO which correlates most closely with integrated circuit maximum frequency may be determined during the testing. In various embodiments, the average, median, worst-case, or any other fitting method may be used to predict the integrated circuit maximum frequency using the plurality of PSROs.

Figure 4:
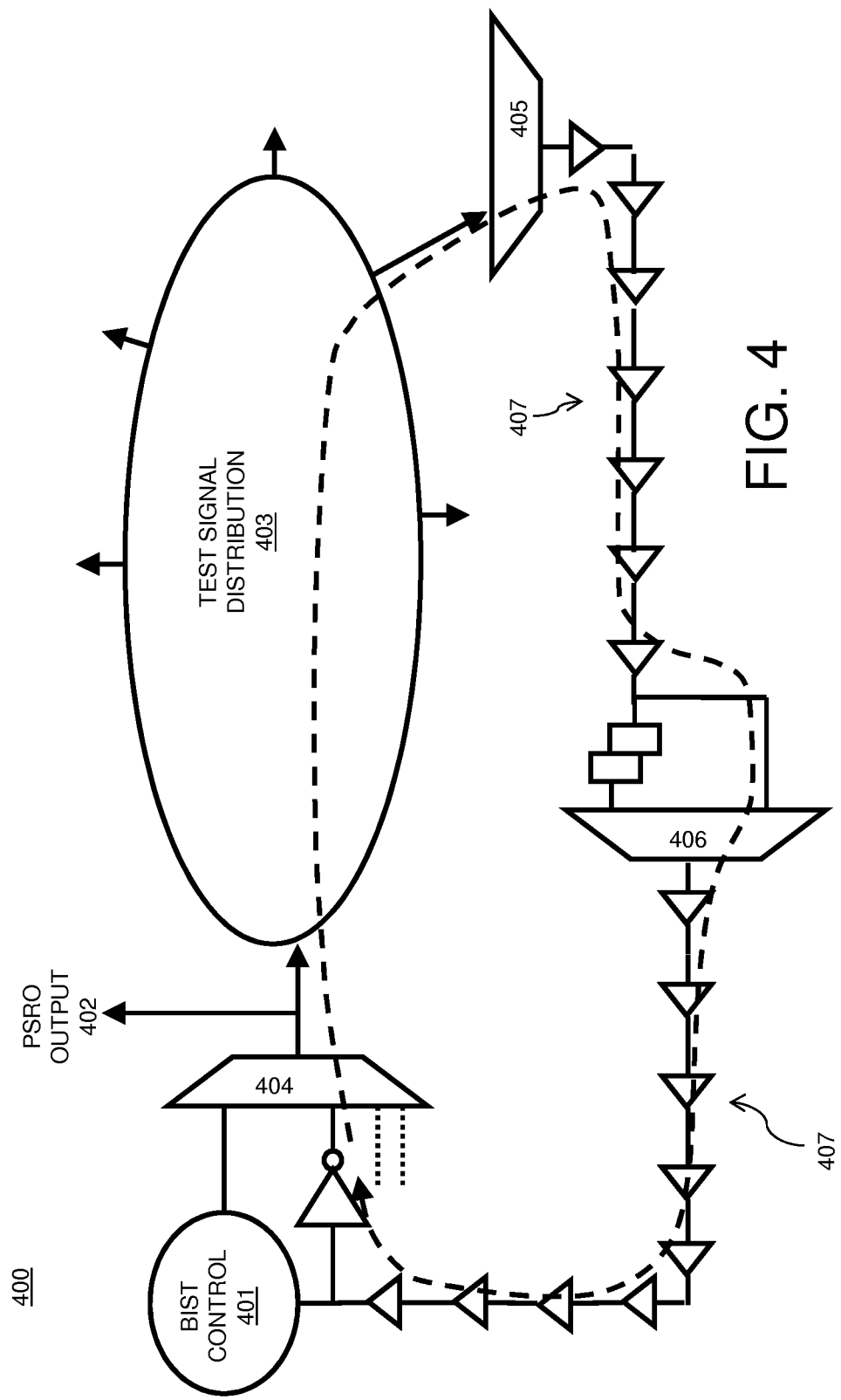
FIG. 4 depicts a PSRO using a test signal distribution network of an integrated circuit in accordance with an embodiment.

FIG. 4 illustrates another embodiment of a PSRO 400 using an integrated circuit test signal distribution network 403, as illustrated by the dotted line. The PSRO 400 is made up of BIST control 401, which may correspond to BIST control 101 of FIG. 1, and is connected to test signal distribution network 403, which may correspond to test signal distribution network 100 of FIG. 1, via input MUX 404. One of the outputs of test signal distribution network 403, which may be any of signal outputs OUT1 to OUT 14 as shown in FIG. 1, is taken as an input by PSRO selector MUX 405. The output of PSRO selector MUX 306 is input to scan return path 407, and which includes bypass MUX 406, which bypasses a latch when the PSRO mode is enabled. The output of bypass MUX 406 is received by a PSRO inverter via scan return path 407, which outputs the PSRO oscillation signal to the input MUX 404, completing the PSRO ring. The frequency of the PSRO is read out at output 402.

Figure 5:
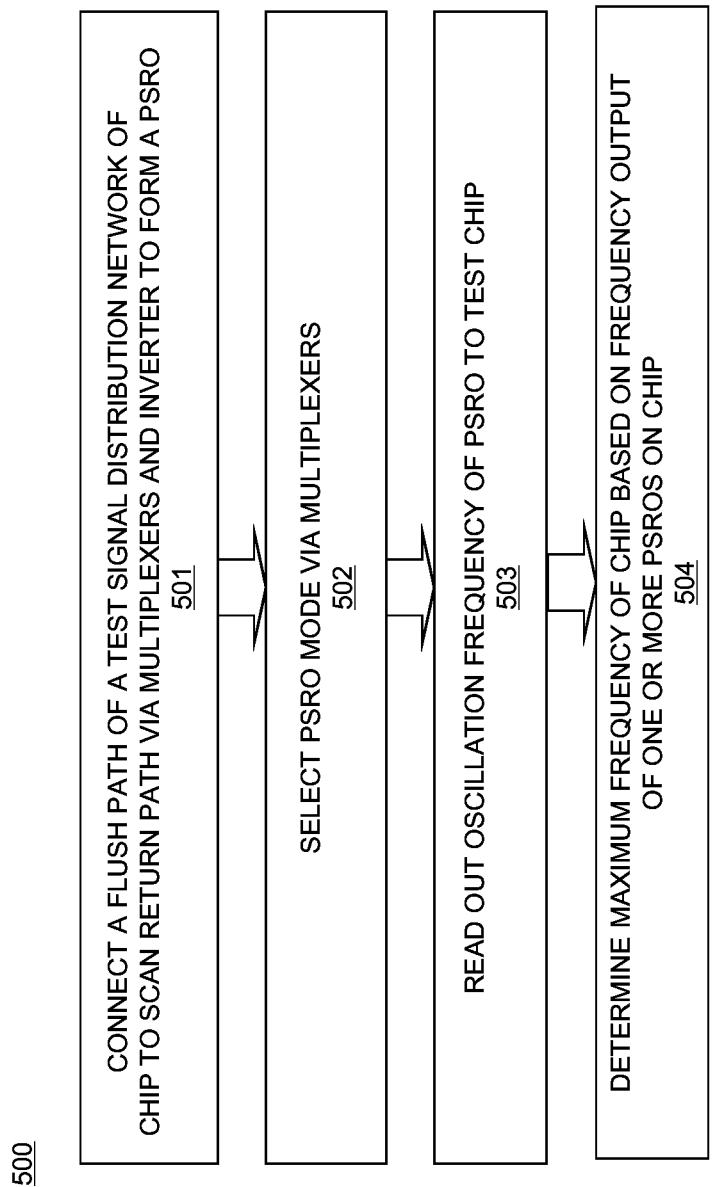
FIG. 5 depicts a process flow for a PSRO using a test signal distribution network of an integrated circuit in accordance with an embodiment.

FIG. 5 illustrates an embodiment of a method 500 for a PSRO using a test signal distribution network on an integrated circuit. First, in block 501, a signal output of a test signal distribution network (such as test signal distribution network 100, 300, or 400) that is made up of flushable pipeline latches on an integrated circuit is connected to a return path, such as a scan return path, to form a ring. An input MUX, in addition to a PSRO selector MUX, a bypass MUX, and a PSRO inverter, are used to form the ring that comprises the PSRO, as shown in FIGS. 3-4. Multiple PSROs may be formed on a single integrated circuit in block 501, each PSRO utilizing a respective signal output (such as signal outputs OUT1-OUT14 of FIG. 1) of the test signal distribution network, and corresponding return path. Next, in block 502, a PSRO mode is selected, via the various multiplexers, in order to enable a PSRO and test the integrated circuit. As shown in FIG. 3, PSRO enable input 308 selects a particular PSRO to enable, and the PSRO selector MUX 306 and bypass MUX 307 are also controlled via scan disable input 311 and bypass enable input 312 to enable the PSRO. In block 503, an oscillation frequency of the enabled PSRO is read out via a PSRO output (e.g., output 309 or 402), and the oscillation frequency is used to determine a performance of the integrated circuit. In block 504, in an integrated circuit that includes a plurality of PSROs, a maximum frequency of the integrated circuit is determined based on the multiple PSRO frequencies.

Technical effects and benefits include formation of one or more PSROs on an integrated circuit with relatively little additional hardware.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An integrated circuit comprising:
a test signal distribution network, the test signal distribution network comprising a plurality of flushable pipeline latches, the test signal distribution network configured to deliver a test signal simultaneously, via the plurality of flushable pipeline latches, to each of a plurality of local clock buffers associated with components of the integrated circuit at a plurality of signal outputs; and
a performance-screen ring oscillator (PSRO) comprising:
an input multiplexer that outputs an oscillator signal to an input of a branch of the test signal distribution network; and
a return path from a signal output of the branch of the test signal distribution network to the input multiplexer.

2. The integrated circuit of claim 1, wherein the PSRO further comprises a PSRO inverter located between the return path and the input multiplexer.

3. The integrated circuit of claim 1, wherein the return path comprises a scan return path of the integrated circuit.

4. The integrated circuit of claim 3, further comprising a selector multiplexer located between the output of the test signal distribution network and the scan return path, wherein the selector multiplexer is configured to select between a scan mode and a PSRO mode of the integrated circuit.

5. The integrated circuit of claim 3, further comprising a bypass multiplexer in the scan return path, the bypass multiplexer configured to bypass a pipeline latch located in the scan return path based on the PSRO being enabled.

6. The integrated circuit of claim 1, wherein the integrated circuit comprises a plurality of PSROs, each of the plurality of PSROs corresponding to a respective signal output of the plurality of signal outputs.

7. The integrated circuit of claim 6, wherein the input multiplexer is connected to a respective return path of each of the plurality of PSROs, such that the input multiplexer selects a PSRO of the plurality of PSROs to enable.

8. The integrated circuit of claim 1, wherein each of the plurality of flushable pipeline latches comprises a flush path used for low frequency testing of the integrated circuit via the scan return path.

9. A performance-screen ring oscillator (PSRO) for an integrated circuit, comprising:
a branch of a test signal distribution network, the test signal distribution network comprising a plurality of flushable pipeline latches, the test signal distribution network configured to deliver a test signal simultaneously, via the plurality of flushable pipeline latches, to each of a plurality of local clock buffers associated with integrated circuit components of the integrated circuit at a plurality of signal outputs;
an input multiplexer that outputs an oscillator signal to an input of a branch of the test signal distribution network; and
a return path from a signal output of the branch of the test signal distribution network to the input multiplexer.

10. The PSRO of claim 9, wherein the PSRO further comprises a PSRO inverter located between the return path and the input multiplexer.

11. The PSRO of claim 9, wherein the return path comprises a scan return path of the integrated circuit.

* * * * *